United States Patent
Maruyama et al.

(10) Patent No.: US 7,531,948 B2
(45) Date of Patent: May 12, 2009

(54) STACKED PIEZOELECTRIC ELEMENT, MANUFACTURING METHOD THEREOF AND VIBRATION WAVE DRIVING APPARATUS

(75) Inventors: Yutaka Maruyama, Taito-ku (JP); Kaishi Ohashi, Ohta-ku (JP); Takayuki Tsukimoto, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/748,701

(22) Filed: May 15, 2007

(65) Prior Publication Data

US 2007/0262679 A1 Nov. 15, 2007

(30) Foreign Application Priority Data

May 15, 2006 (JP) .............. 2006-135598

(51) Int. Cl.
 *H01L 41/00* (2006.01)
(52) U.S. Cl. ............. 310/369; 310/323.12; 310/323.16; 310/365; 310/366
(58) Field of Classification Search ........ 310/365, 310/366, 369, 323.12, 323.16
See application file for complete search history.

(56) References Cited

U.S. PATENT DOCUMENTS

| | | | | |
|---|---|---|---|---|
| 6,437,489 B1 * | 8/2002 | Shinke et al. | ............... | 310/369 |
| 6,559,574 B2 * | 5/2003 | Maruyama | ............. | 310/323.02 |
| 2002/0195906 A1 * | 12/2002 | Maruyama | ................. | 310/366 |

FOREIGN PATENT DOCUMENTS

| | | | |
|---|---|---|---|
| JP | 03016188 | * | 1/1991 |
| JP | 06-077550 A | | 3/1994 |
| JP | 06-120580 A | | 4/1994 |
| JP | 08-213664 A | | 8/1996 |
| JP | 2961545 B2 | | 8/1999 |

* cited by examiner

*Primary Examiner*—Thomas M Dougherty
*Assistant Examiner*—Bryan P Gordon
(74) *Attorney, Agent, or Firm*—Rossi, Kimms & McDowell, LLP

(57) ABSTRACT

A stacked piezoelectric element comprising that can suppress periodic damping on miniaturization of a vibration wave motor and improve its performance. A stacked piezoelectric element comprises piezoelectric layers and electrode layers alternately stacked to have a shape of a cylinder. The electrode layers are divided into a plurality of electrode layer regions along a circumferential surface of the shape of a cylinder.

8 Claims, 9 Drawing Sheets

STACKED PIEZOELECTRIC ELEMENT, MANUFACTURING METHOD THEREOF AND VIBRATION WAVE DRIVING APPARATUS

BACKGROUND OF THE INVENTION

1. Field of the Invention

The present invention relates to a stacked piezoelectric element in which a piezoelectric layer and an electrode layer are stacked, a manufacturing method thereof and a vibration wave driving apparatus.

2. Description of the Related Art

Conventionally, piezoelectric material is a typical material that has electromechanical energy conversion functions, and is used as piezoelectric elements in various applications. Recently, stacked piezoelectric elements in which plurality of layers are stacked, integrally formed and sintered are commonly used.

For instance, Japanese Laid-Open Patent Publication (Kokai) No. 6-77550, Japanese Laid-Open Patent Publication (Kokai) No. 6-120580 and Japanese Laid-Open Patent Publication (Kokai) No. 8-213664 disclose a configuration in which the stacked piezoelectric element is used for a vibration wave motor as a vibration wave driving apparatus, and in particular, for a vibration wave motor which is formed like a column. Japanese Patent No. 2961545 discloses a vibration wave motor which uses no stacked piezoelectric element but uses a cylindrical and single-layer piezoelectric element and generates a bending vibration as a vibrating body.

The stacked piezoelectric element is characterized in that, in comparison with a single-layer piezoelectric element, a great deformation strain and a great force can be obtained at a low voltage by layer stacking, miniaturization is possible because thickness of one stacked layer can be rendered thinner, and the like.

The stacked piezoelectric element comprises a plurality of piezoelectric layers of piezoelectric material and a plurality of electrode layers of conductive material arranged adjacent to the each piezoelectric layer. A method of manufacturing the stacked piezoelectric element is as follows. In a sheet manufacturing process, a green sheet to be the piezoelectric layer is created from piezoelectric material powder and an organic binder by a method such as a doctor blade method or a die coater so as to render it as an electrode layer by printing a conductive paste in a predetermined position on the green sheet. In a layer stacking process, a predetermined number of the green sheets are stacked on each other's flat surface and stacked by pressurizing them with a press. Thereafter, firing and polarization processes are performed so that they are eventually machined to be plate-formed or ring-formed. The stacked piezoelectric element is manufactured through these processes.

FIGS. 9A and 9B are perspective views showing the stacked piezoelectric element used for the vibrating body of a conventional columnar vibration wave motor. FIG. 9A shows the stacked piezoelectric element in which a plurality of layers are stacked on each other's flat surface, and FIG. 9B shows the stacked piezoelectric element broken down into individual layers.

A stacked piezoelectric element 30 includes a plurality of hollow piezoelectric layers 32 which are stacked on each other's flat surface. The piezoelectric layer 32 has an electrode layer 33 which is quartered (shaded areas in the drawing) formed on its surface. The piezoelectric layer 32 also has connection electrodes 33a formed on its surface, which are connected to the electrode layer 33 and extended to an outer circumference of the piezoelectric layer 32.

The connection electrode 33a connected to each piece of the electrode layer 33 is provided in the same phase position (angular position) on every other layer. The stacked piezoelectric element 30 has interlayer electrodes 34 formed on its outer circumference, which conduct a plurality of connection electrodes 33a located in the same phase positions. The piezoelectric layer 32 positioned as a top layer also has a plurality of surface electrodes 35 formed in a circumferential direction on its surface rim, which are connected to the interlayer electrodes 34 corresponding to them respectively. A voltage is applied to the surface electrodes 35 and the polarization process is thereby performed so as to allow the columnar vibration wave motor which comprises the connection electrode 33a to drive.

Here, a principle of the columnar vibration wave motor is shown. The vibrating body is configured by tightly holding the stacked piezoelectric element with metal components. If a predetermined AC voltage is applied to the stacked piezoelectric element from a driving circuit (not shown), the vibrating body has two bending vibrations orthogonal to its axial direction generated with a temporal phase difference. The two bending vibrations generate an oscillating movement at the end of the metal component. Further, the end of the metal component, generating an oscillating movement, operates as a driving unit which rotates a contact body, pressurizing and contacting the end of the metal component, by means of frictional contact.

FIG. 10 is a sectional view showing a structure of the columnar vibration wave motor including the vibrating body using the stacked piezoelectric element of FIGS. 9A and 9B. This columnar vibration wave motor 40 has a vibrating body 41 incorporated therein. The vibrating body 41 has the stacked piezoelectric element 30 placed between hollow metal components 43 and 44 together with a hollow wiring substrate 42 of which base material is a polymer material so that the wiring substrate 42 contacts the surface electrodes 35 of the stacked piezoelectric element 30. And a bolt 45 inserted from the metal component 43 side is screwed into the metal component 44, and the stacked piezoelectric element 30 is thereby tightly held and fixed between the metal components 43 and 44 together with the wiring substrate 42.

Thus, the AC voltage from the driving circuit is applied to the surface electrodes 35 of the stacked piezoelectric element 30 via the wiring substrate 42. As a result of this, a rotor (contact body) 48 pressurizing and contacting the end of the metal component 44 by means of a spring 46 and a spring support 47 is rotated by the aforementioned oscillating movement so as to take out a rotation output via a gear 49 which rotates together with the rotor 48.

However, the conventional stacked piezoelectric element had the following problem. To be more precise, the vibration wave motor is currently desired to further reduce its manufacturing cost, not to mention realizing miniaturization and higher output thereof.

In the case of miniaturizing the conventional columnar vibration wave motor, however, adhesiveness of a contact surface between the stacked piezoelectric element 30 and the metal component 44 is reduced and influence of periodic damping becomes stronger. Furthermore, this reduction in adhesiveness and the periodic damping cause lowering performance of the vibration wave motor.

In the case of the conventional manufacturing method, large-scaled manufacturing equipment needs for the sheet manufacturing process of manufacturing sheets from the piezoelectric material powder and the layer stacking process of pressing and stacking them, which also increases an amount of capital investment. In addition, machining was eventually required for the piezoelectric elements manufactured from the sheets, which may cause reducing yields of the material as well and also increases the manufacturing cost.

As for the vibration wave motor which uses the cylindrical and single-layer piezoelectric element and generates the bending vibration as a vibrating body, a high voltage was required in the case of increasing a displacement of the bending vibration because of the single layer. For this reason, the cost of electrical parts such as a transformer became high. These parts required large space as an electrical circuit portion in spite of miniaturization.

SUMMARY OF THE INVENTION

The present invention provides a stacked piezoelectric element that can suppress periodic damping on miniaturization of a vibration wave motor and improve its performance, a manufacturing method thereof and a vibration wave driving apparatus.

In a first aspect of the present invention, there is provided a stacked piezoelectric element comprising piezoelectric layers and electrode layers alternately stacked to have a shape of a cylinder, wherein the electrode layers are divided into a plurality of electrode layer regions along a circumferential surface of the shape of a cylinder.

In a second aspect of the present invention, there is provided a method of manufacturing a stacked piezoelectric element, comprising a layer stacking step of stacking piezoelectric layers and electrode layers so as to have a shape of a cylinder by alternately and cylindrically applying a piezoelectric material paste including piezoelectric material powder and an organic vehicle as its main components and a conductive paste including conductive body powder and an organic vehicle as its main components, and a firing step of firing the piezoelectric layers and electrode layers stacked in the layer stacking step, and wherein the conductive paste is dividedly applied to a plurality of areas along a circumferential surface formed by the cylinder in the layer stacking step.

In a third aspect of the present invention, there is provided a vibration wave driving apparatus including a vibrating body adapted to make an oscillating movement by at least two bending vibrations, and a contact body adapted to contact the vibrating body, moving the contact body through frictional contact by generating the vibrations to the vibrating body, wherein the vibrating body comprises piezoelectric layers and electrode layers alternately stacked to have a shape of a cylinder, and the electrode layers are divided into a plurality of electrode layer regions along a circumferential surface of the shape of the cylinder.

Further features and aspects of the present invention will become apparent from the following detailed description of exemplary embodiments with reference to the attached drawings.

BRIEF DESCRIPTION OF THE DRAWINGS

FIG. 3A shows a horizontal sectional view along a line (C to C line) orthogonal to a central axis of the stacked piezoelectric element and FIG. 3B shows a vertical sectional view along a line (D to D line) passing through the central axis of the stacked piezoelectric element.

FIG. 9A shows the stacked piezoelectric element in which a plurality of layers are stacked on each other's flat surface, and FIG. 9B shows the stacked piezoelectric element broken down into individual layers.

DETAILED DESCRIPTION OF THE PREFERRED EMBODIMENTS

The following description of an exemplary embodiment, features and aspects of the present invention is merely illustrative in nature and is in no way intended to limit the invention, its application, or uses.

Hereunder, a detailed description will be given as to the embodiment of the present invention with reference to the drawings.

A stacked piezoelectric element according to an embodiment of the present invention is cylindrically formed and incorporated into a vibration wave motor.

(Structure of the Stacked Piezoelectric Element)

Figure 1:
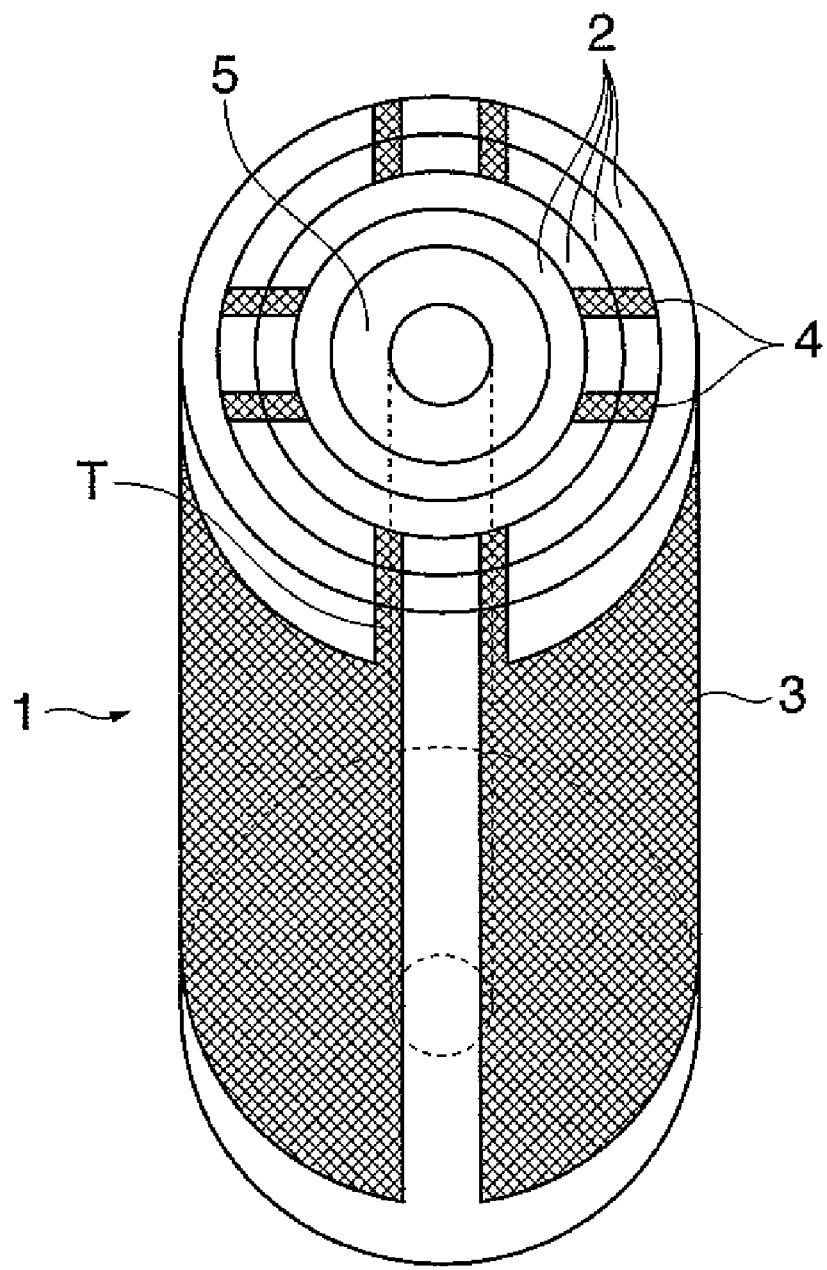
FIG. 1 is a diagram showing a view of a stacked piezoelectric element according to an embodiment of the present invention.

FIG. 1 is a diagram showing a view of a stacked piezoelectric element according to an embodiment of the present invention. In FIG. 1, a stacked piezoelectric element 1 includes piezoelectric layers 2 composed of four layers which are concentrically (cylindrically) stacked on an outer circumference of a core 5. On an outer circumferential surface of each individual piezoelectric layer 2, an electrode layer 3 and a connection electrode T extended from the electrode layer 3 to an end face are formed. To be more specific, a plurality of piezoelectric layers 2 and a plurality of electrode layers 3 are alternately formed to be cylindrically stacked. On the end face of the stacked piezoelectric element 1, interlayer electrodes 4 for conducting connection electrodes T of the piezoelectric layers 2 are formed.

Figure 2:
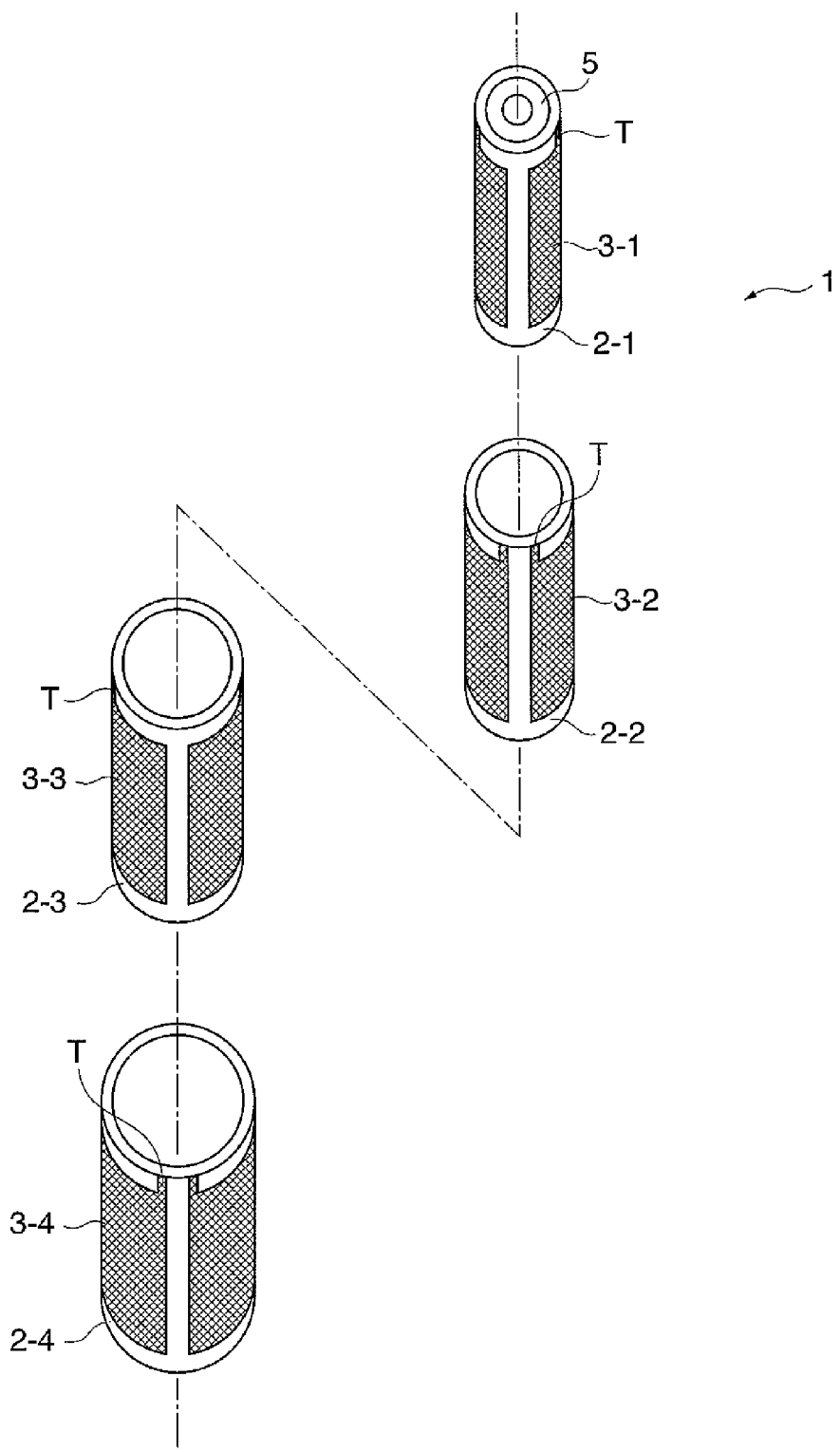
FIG. 2 is an exploded perspective view showing a structure of the stacked piezoelectric element of FIG. 1.

FIG. 2 is an exploded perspective view showing a structure of the stacked piezoelectric element 1 of FIG. 1. As previously described, cylindrical piezoelectric layers 2 (2-1, 2-2, 2-3 and 2-4) of different diameters are formed, by centering on the core 5 with hollow center, to be concentrically (cylindrically) stacked in order from an inner diameter portion to an outer diameter portion. The piezoelectric layers 2 are firmly attached to one another via the electrode layers 3 (3-1, 3-2, 3-3 and 3-4).

Figure 3A:
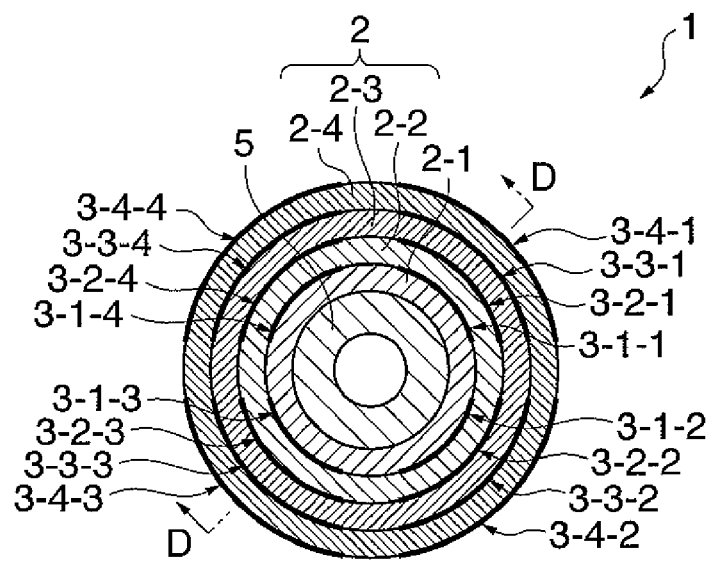
FIGS. 3A and 3B are sectional views showing a structure of the stacked piezoelectric element, where
Figure 3B:
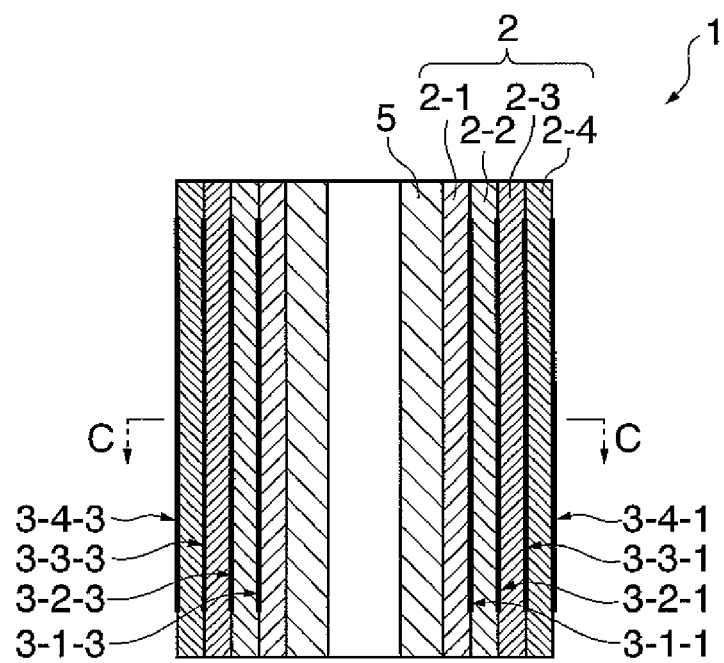

FIGS. 3A and 3B are sectional views showing a structure of the stacked piezoelectric element 1, where FIG. 3A shows a horizontal sectional view along a line (C to C line) orthogonal to a central axis of the stacked piezoelectric element 1 and FIG. 3B shows a vertical sectional view along a line (D to D line) passing through the central axis of the stacked piezoelectric element 1.

Each of the electrode layers 3 (3-1, 3-2, 3-3 and 3-4) formed on the outer circumferential surfaces of the piezoelectric layers 2 (2-1, 2-2, 2-3 and 2-4) is divided into four areas. To be more precise, on the piezoelectric layer 2-1, the electrode layer 3-1 is divided into the areas of the four electrode layers 3-1-1, 3-1-2, 3-1-3 and 3-1-4 at even intervals. Similarly, on the piezoelectric layer 2-2, the electrode layer 3-2 is divided into the areas of the four electrode layers 3-2-1, 3-2-2, 3-2-3 and 3-2-4 at even intervals. On the piezoelectric layer 2-3, the electrode layer 3-3 is divided into the areas of the four electrode layers 3-3-1, 3-3-2, 3-3-3 and 3-3-4 at even intervals. On the piezoelectric layer 2-4, the electrode layer 3-4 is divided into the areas of the four electrode layers 3-4-1, 3-4-2, 3-4-3 and 3-4-4 at even intervals. Here, being divided at even intervals means to be divided so that center angles become equal.

Figure 4:
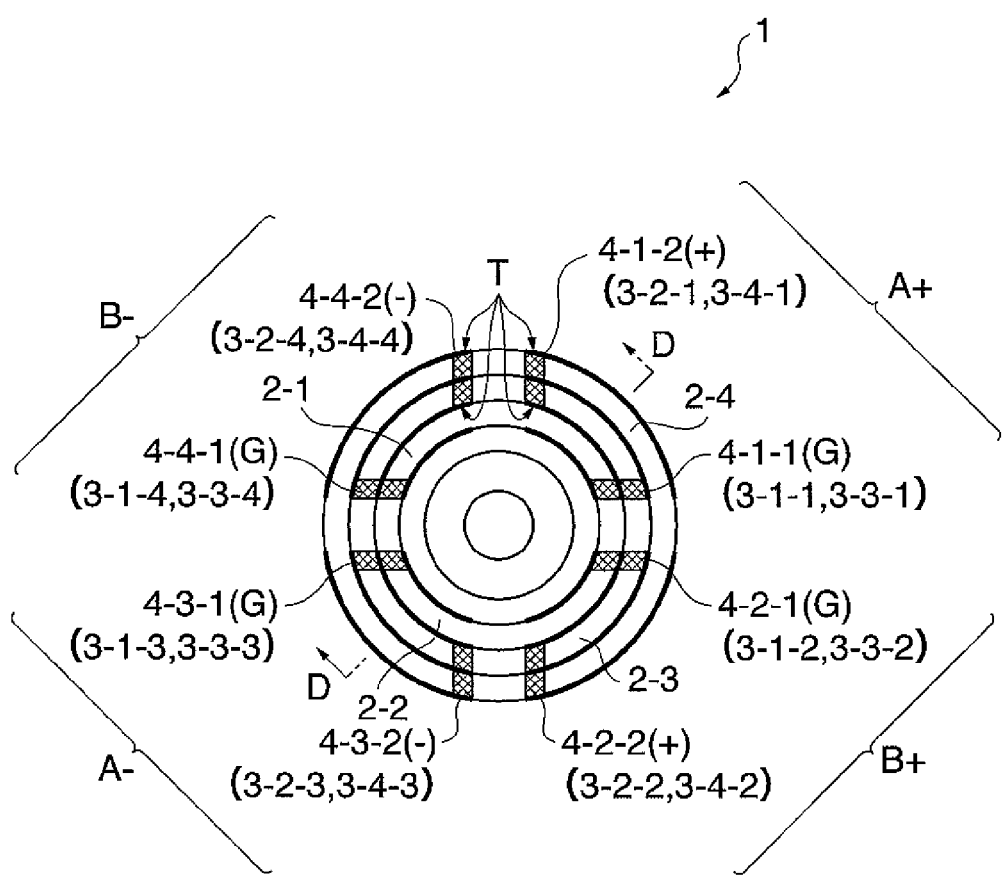
FIG. 4 is a diagram showing one end face of the stacked piezoelectric element.

FIG. 4 is a diagram showing one end face of the stacked piezoelectric element 1. On the end faces of the piezoelectric layers 2-1, 2-2, 2-3 and 2-4, the electrode layers 3 are extended from the divided four areas respectively, where four connection electrodes T are exposed per layer. The four connection electrodes T are placed on each of the layers shifted a positional phase (angular position) by 90 degrees.

One end face of the stacked piezoelectric element 1 has eight interlayer electrodes 4 (4-1-1 to 4-4-2) formed thereon, which bring the connection electrodes T of the layers into conduction. To be more specific, the interlayer electrode 4-1-1 as a ground (GND) electrode brings the electrodes 3-1-1 to 3-3-1 into conduction via the connection electrodes T. Similarly, the interlayer electrodes 4-2-1, 4-3-1 and 4-4-1 as GND electrodes bring the electrodes 3-1-2 to 3-3-2, electrodes 3-1-3 to 3-3-3 and electrodes 3-1-4 to 3-3-4 into conduction via the connection electrodes T respectively.

The interlayer electrode 4-1-2 as a plus (+) electrode brings the electrodes 3-2-1 to 3-4-1 into conduction via the connection electrodes T. Similarly, the interlayer electrode 4-2-2 as a plus (+) electrode brings the electrodes 3-2-2 to 3-4-2 into conduction via the connection electrodes T.

The interlayer electrode 4-3-2 as a minus (−) electrode brings the electrodes 3-2-3 to 3-4-3 into conduction via the connection electrodes T. Similarly, the interlayer electrode 4-4-2 as a minus (−) electrode brings the electrodes 3-2-4 to 3-4-4 into conduction via the connection electrodes T.

(Method of Manufacturing the Stacked Piezoelectric Element)

Next, a method of manufacturing the stacked piezoelectric element 1 will be shown. First, piezo-ceramic powder and organic vehicle as main components are mixed to produce a piezoelectric material paste capable of forming a thick film. The piezoelectric material paste is applied to the piezo-ceramic outer circumferential surface which is the cylindrical core 5 by screen printing or the like. The applied piezoelectric material paste is dried to form the piezoelectric layer 2-1.

Thereafter, conductive body powder of which main component is silver or silver and palladium is mixed with the organic vehicle to crate a conductive paste. The conductive paste is applied likewise to the surface of the piezoelectric layer 2-1 by screen printing or the like. The applied conductive paste is dried to form the electrode layer 3-1 and the connection electrode T.

In a similar process, the piezoelectric material paste and the conductive paste are alternately applied and dried to implement layer stacking, and thus the piezoelectric layers 2 (2-2, 2-3 and 2-4) and the electrode layers 3 (3-2, 3-3 and 3-4) and the connection electrodes T are formed.

Thereafter, the organic vehicle is burned at 200° C. to 500° C. and fired in a lead atmosphere of 1100° C. to 1200° C.

After the firing, both the end faces of the stacked piezoelectric element 1 are slightly ground and eventually finished at a predetermined length to be flattened. As a result of this, the connection electrodes T conducting to the electrode layers 3 are exposed on the end faces. Furthermore, a silver conductive body including an adhesive which can be hardened by heating is applied to eight locations on the end faces by screen printing and heated so as to form the interlayer electrodes 4.

According to this embodiment, when producing the piezoelectric material paste for forming the piezoelectric layers 2, some additive was added to the piezoelectric material powder, and the organic vehicle using organic binder such as ethylcellulose and organic solvent such as terpineol were blended in three rolls so as to produce the paste.

Similarly, when producing the conductive paste for forming the electrode layers 3, some additive was added to the conductive body powder, and the organic vehicle using an organic binder such as ethylcellulose and an organic solvent such as terpineol were blended in three rolls so as to produce the paste.

As for the additives in these cases, a slight amount of sintering additive or metal oxide was added to the piezoelectric material paste, and a small quantity of the piezoelectric material powder, another metal powder or the like was added to the conductive paste in order to mainly adjust its amount of contraction due to sintering and improve its electrical properties.

Figure 5:
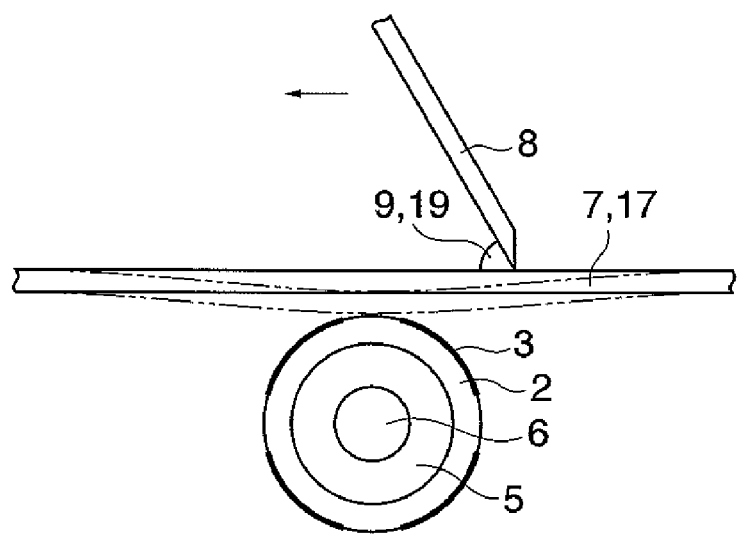
FIG. 5 is a diagram showing a principle of forming a piezoelectric layer and an electrode layer in FIG. 1 by screen printing.

FIG. 5 is a diagram showing a principle of forming the piezoelectric layer 2 and the electrode layer 3 in FIG. 1 by screen printing. Piezoelectric ceramics to be the core 5 is mounted on a supporting portion 6 to support the core 5 with the inner diameter portion. In this case, an appropriate clearance is provided between a screen 7 having a flat surface and the outer circumferential surface of the core 5. And a squeegee 8 contacting the screen 7 at an appropriate surface pressure is moved in a horizontal direction (in a direction indicated by an arrow in FIG. 5). In this case, a moving position of the squeegee 8 is synchronized with rotation of the core 5. A piezoelectric material paste 9 which is viscous is applied to the outer circumference of the core 5 through the screen 7 contacting the core 5 while being pushed down by the squeegee 8 and sagging, and thus the piezoelectric layer 2 is formed.

Furthermore, another screen 17 having a pattern of the electrode layer 3 formed thereon is used to perform the same process. A conductive paste 19 is thereby applied to the outer circumference of the piezoelectric layer 2, and the divided electrode layers 3 are formed.

According to this embodiment, the stacked piezoelectric element 1 has dimensions of 5-mm outer diameter, 4-mm inner diameter and about 10-mm length. The core 5 is composed of sintered piezoelectric ceramics, and has dimensions of 4.8-mm outer diameter, 4-mm inner diameter and about 6-mm length. Thickness of the each piezoelectric layer 2 is 20 µm. Thickness of the each electrode layer 3 is 2 to 3 µm. The stacked piezoelectric element comprise the four piezoelectric layers 2 and the four electrode layers 3 respectively.

According to this manufacturing method, the piezoelectric layer 2 composed of a thick film of 2 to 3-µm to 30-µm thickness can be created with high accuracy. The electrode layer 3 can also be created with the same thickness. However, it does not need to be excessively thick, and excessive thickness also leads to higher cost. Therefore, it is created with 2 to 3-μm to 10-μm thickness.

As for the material of the core 5, it is desirable to use a material wherein an abnormal chemical reaction seldom occurs to generate a foreign substance even if the material is stacked on the piezoelectric layer 2 and fired. It is thereby possible to form the piezoelectric layer 2 having a sound piezoelectric property. To be more precise, the material of the core 5 should desirably be a material which seldom causes the above chemical reaction and has approximately the same main component as the piezoelectric layer 2.

The core 5 may be either fired ceramics or unfired ceramics if it has approximately the same main component as the piezoelectric layer 2. In the case where the core 5 is the fired ceramics, only stacked portions of the stacked piezoelectric layers 2 and electrode layers 3 contract so that the stacked piezoelectric element 1 of expected dimensions can be created without a significant change in the dimensions.

In the case where the core 5 is the fired ceramics, however, the core 5 does not contract on firing while the piezoelectric layer 2 and the electrode layer 3 contract. Therefore, the piezoelectric layer 2 and the electrode layer 3 are apt to exfoliate from the core 5.

According to this embodiment, the piezoelectric layer 2 is formed on the outer circumference of the core 5. As individual crystal grains of sintered ceramics forming the surface of the core 5 and individual crystal grains forming the piezoelectric layer 2 have approximately the same components, the core 5 and the piezoelectric layer 2 are easily combinable to facilitate firm attachment thereof.

It is desirable that the surface of the core 5 be a rough surface rather than a smooth surface. Thus, contact area of the surface of the core 5 against the piezoelectric layer 2 becomes large, and exfoliation hardly occurs. Therefore, it is desirable to perform a pretreatment of mechanically roughening the surface of the core 5 with a grindstone including diamond or the like before forming the piezoelectric layer 2.

In the case where the core 5 is the unfired ceramics, the core 5 contracts together with the stacked portions composed of the stacked piezoelectric layer 2 and the electrode layer 3, and the binding of the stacked portions and the core 5 is good although the change in dimensions is significant. It is thereby possible to prevent a defect, such as exfoliation of the stacked portions. It is possible to create the core 5 by a conventional manufacturing method such as powder molding or extrusion molding.

The piezoelectric material as for the piezoelectric layer 2 and the core 5 comprises the piezoelectric ceramics of a three-component system or a multicomponent system which has lead titanate and lead zirconate ($PbZrO_3$—$PbTiO_3$) of a perovskite crystal structure including lead as the main components. More specifically, the piezoelectric material is formed by solid solution-forming the piezoelectric ceramics after adding small quantity of a compound composed of a plurality of metal elements. Lately, lead-free piezoelectric materials using no lead are also under development. In the case of forming the piezoelectric layer 2 by using the lead-free piezoelectric material, the core 5 has approximately the same components so that the chemical reaction is suppressed and which allows formation of the piezoelectric layer 2 and the electrode layer 3 having sound piezoelectric property.

Furthermore, it is possible, as another manufacturing method, to form the layers by using the core 5 and only fire the stacked portion by pulling out the core 5 before the firing. In this case, the material of the core 5 may be a polymer material rather than the piezoelectric ceramics. This manufacturing method is suited to the case of creating a stacked piezoelectric element of a small diameter.

(Polarization Process)

The interlayer electrodes 4 are used to perform a process of polarizing the piezoelectric layer 2 of the stacked piezoelectric element 1 in a specific polarization direction suited to a vibration wave motor. To be more precise, the polarization process is performed by pressing metallic pins (not shown) against the eight interlayer electrodes 4 (refer to FIG. 4). The interlayer electrodes 4-1-1, 4-2-1, 4-3-1 and 4-4-1 are the ground (G) electrodes, the interlayer electrodes 4-1-2 and 4-2-2 are the plus (+) electrodes, and the interlayer electrodes 4-3-2 and 4-4-2 are the minus (−) electrodes. The polarization process was performed by soaking the stacked piezoelectric element 1 in oil at temperature of 120 to 140° C. for about 30 to 60 minutes in a state of applying voltages of +60 V to the plus (+) electrodes and −60 V to the minus (−) electrodes respectively.

Figure 6:
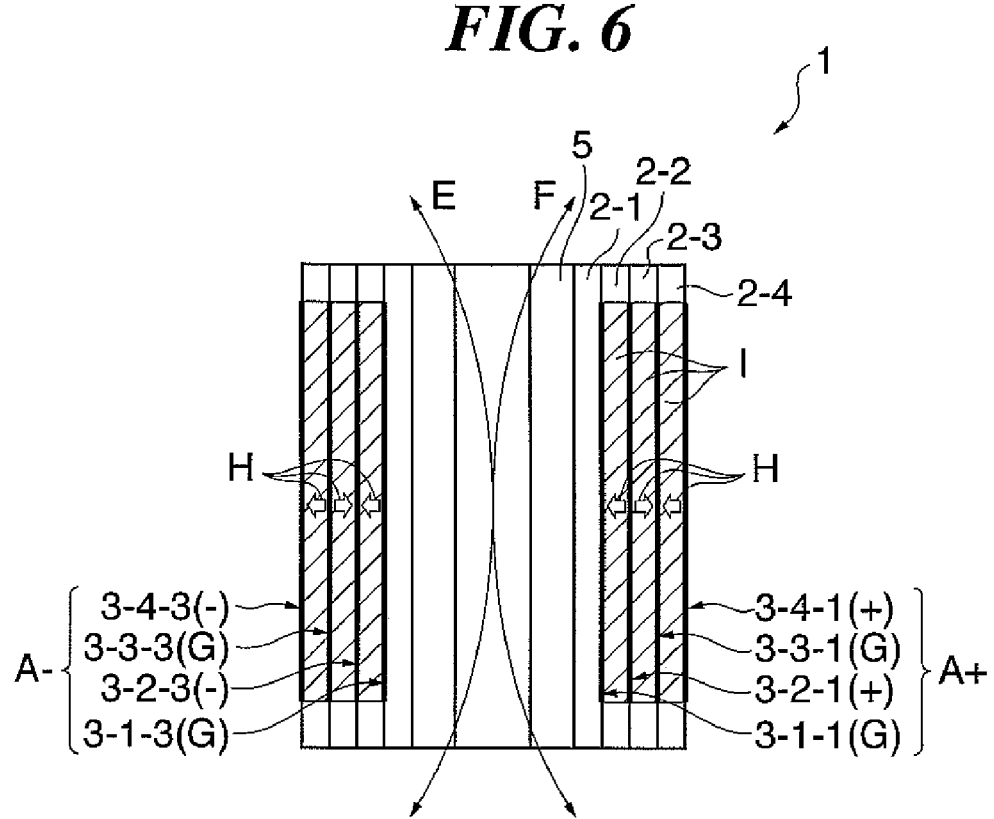
FIG. 6 is a diagram showing a polarized state of the stacked piezoelectric element after a polarization process.

FIG. 6 is a diagram showing a polarized state of the stacked piezoelectric element 1 after the polarization process. FIG. 6 is a vertical sectional view along a line (D to D line) passing through the central axis of the stacked piezoelectric element 1, which shows the polarization direction. As a result of the polarization process, piezoelectric active regions I (hatched area in the drawing) of the piezoelectric layers 2 on the electrode layer 3 side having a plus (+) voltage applied and the electrode layer 3 side having a minus (−) voltage applied to an electrical ground (G) are polarized in the directions indicated by arrows H respectively.

The interlayer electrode 4-1-1 (G) and interlayer electrode 4-1-2 (+) side is an A+ phase, and the interlayer electrode 4-3-1 (G) and interlayer electrode 4-3-2 (−) side which is in a positional relation of 180 degrees to the A+ phase is an A− phase. Furthermore, the A+ phase and A− phase are A phases (refer to FIG. 4).

The interlayer electrode 4-2-1 (G) and interlayer electrode 4-2-2 (+) side is a B+ phase, and the interlayer electrode 4-4-1 (G) and interlayer electrode 4-4-2 (−) side which is in a positional relation of 180 degrees to the B+ phase is a B− phase. Furthermore, the B+ phase and B− phase are B phases.

If a high-frequency voltage approximately matching with a natural frequency of the stacked piezoelectric element 1 is applied to the A phases shown in FIG. 4, that is, between the interlayer electrode 4-1-1 and the interlayer electrode 4-1-2 and between the interlayer electrode 4-3-1 and the interlayer electrode 4-3-2, the A+ phase and A− phase alternately expand and contract so that bending vibrations indicated by arrows E and F in FIG. 6 alternately occur. Similarly, if a high-frequency voltage approximately matching with the natural frequency of the stacked piezoelectric element 1 is applied to the B phases shown in FIG. 4, that is, between the interlayer electrode 4-2-1 and the interlayer electrode 4-2-2 and between the interlayer electrode 4-4-1 and the interlayer electrode 4-4-2, the bending vibration occurs in a direction (not shown) orthogonal to the bending vibration of the A− phase in FIG. 6.

Figure 7:
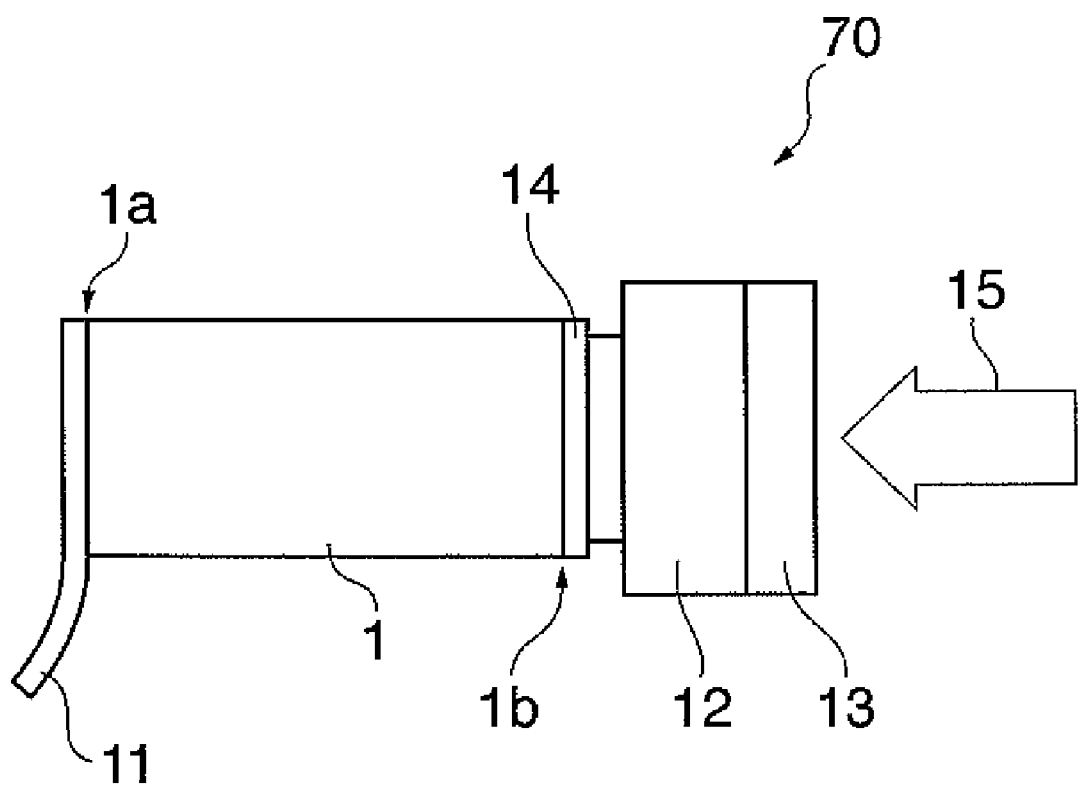
FIG. 7 is a diagram showing a vibration wave motor having the stacked piezoelectric element incorporated therein.

FIG. 7 is a diagram showing a vibration wave motor having the stacked piezoelectric element 1 incorporated therein. In FIG. 7, a vibration wave motor 70 has a flexible circuit board 11 attached to the interlayer electrode 4 (not shown) located on an end face 1a of the stacked piezoelectric element 1. The flexible circuit board 11 is connected to a driving circuit (not shown). Here, to the common ground (G), a high-frequency voltage approximately matching with the natural frequency of the stacked piezoelectric element 1 as a vibrating body is applied to the A phases from the driving circuit, and a high-frequency voltage of a phase difference of 90 degrees from the A phases is further applied to the B phases. Thus, two bending vibrations are generated to the stacked piezoelectric element 1 so that the stacked piezoelectric element 1 makes an oscillating movement due to the two bending vibrations with a temporal phase difference.

On the other end face 1b of the stacked piezoelectric element 1, a convex rotor 12 having a pressurizing force 15 applied thereto has its projection in contact with the end face 1b. The rotor 12 rotates by friction with the other end face 1b as a drive member. The rotor 12 is provided with a gear 13 to be together therewith so that a rotational power of the rotor 12 can be drawn via the gear 13.

If the rotor 12 directly pressurizes and contacts the end face 1b of the stacked piezoelectric element 1, the piezoelectric layers 2 are apt to wear. Therefore, this embodiment improves durability by providing a friction plate 14 made of fairly wear-resistant metal or ceramics between the rotor 12 and the end face 1b.

Thus, the stacked piezoelectric element 1 of this embodiment has a (multilayer) structure in which the piezoelectric layers 2 and the electrode layers 3 are alternately and concentrically (cylindrically) stacked. Therefore, the two bending vibrations can be caused by the stacked piezoelectric element 1 itself which is drivable at low voltage. For this reason, in the case of using the stacked piezoelectric element 1 as the vibrating body of the vibration wave motor 70, it is unnecessary to use a metal component unlike conventional vibration wave motors. To be more specific, it is possible to eliminate the periodic damping due to joint or adhesion of the conventional stacked piezoelectric element and the metal component from the vibration wave motor 70, which deteriorated the performance of the conventional vibration wave motor. It is thereby possible to significantly reduce the periodic damping of the vibration wave motor 70 so as to improve the motor performance. Most of all, as the vibration wave motor 70 requires no metal component, the manufacturing cost can be reduced. This is very advantageous when developing a new vibration wave motor aimed at small size and high output.

According to this manufacturing method, the piezoelectric layers 2 can be formed by producing the piezoelectric material paste from the piezoelectric material powder and directly applying it as-is to the outer circumferential surface of the core 5 having the shape of cylindrical or columnar. Furthermore, layer stacking of the piezoelectric layers 2 and the electrode layers 3 can be easily performed by additionally applying the conductive paste. Moreover, the thickness of the piezoelectric layer 2 due to application of the piezoelectric material paste is thin, such as 2 to 3-μm to 30-μm thickness, which allows the piezoelectric layer 2 to create with higher accuracy.

Unlike the conventional manufacturing method, a sheet manufacturing process and a layer stacking process requiring large-size manufacturing facilities are unnecessary, leading to miniaturization of the manufacturing equipment and space saving, simplification of the manufacturing processes, reduction in hours and eventually to reduction in cost. In addition, the sheets are not created and the piezoelectric layers 2 can be formed on the outer circumference of the core 5 with high accuracy, and so machining of the outer diameter of the stacked piezoelectric element 1 can be significantly reduced so as to allow the yields of the material to be improved.

The present invention is not limited to the configuration of the embodiment but is also applicable to any function indicated in claims or any configuration attainable by the functions of the configuration of the embodiment.

For instance, in the embodiment, the interlayer electrodes 4 are provided on one end face 1a of the stacked piezoelectric element 1. However, the interlayer electrodes may also be dividedly provided on the end faces 1a and 1b. And the friction plate made of metal or ceramics may also be provided on the back of each of the two interlayer electrodes.

Figure 8A:
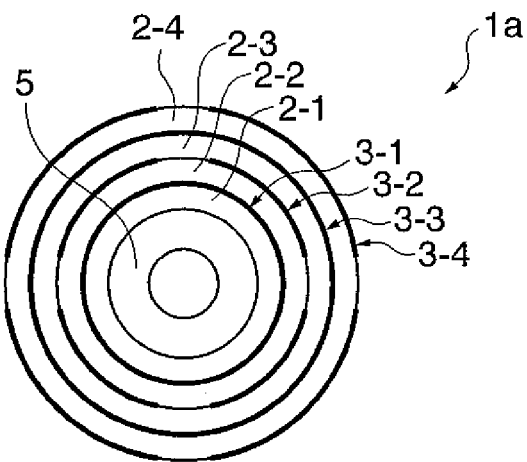
FIGS. 8A to 8C are sectional views showing variation structures of the stacked piezoelectric element in FIG. 1.

As shown in FIG. 4, in the embodiment, each of the electrode layers 3 is divided into four areas. However, it is not limited thereto. For instance, in the case where the interlayer electrodes 4-1-1, 4-2-1, 4-3-1 and 4-4-1 in FIG. 4 are the common ground (G), there is no need to divide each of the electrode layers 3 into four areas. In this case, as shown in FIG. 8A, a stacked piezoelectric element 1a includes the electrode layers 3-1, 3-2, 3-3 and 3-4, where each of the layers goes round and the interlayer electrodes 4-1-1, 4-2-1, 4-3-1 and 4-4-1 are at the same potential as the common ground (G).

In principle, if the oscillating movement occurs to the stacked piezoelectric element 1, a bending movement which is caused to the stacked piezoelectric element 1 is not limited to this embodiment. To be more precise, it is not limited to the bending movement in two directions as in this embodiment, but the bending movement may be made only in one direction or in more directions than this embodiment. For instance, in the case of making the bending movement only in one of the directions of the A+ phase and B+ phase, A+ phase and B− phase, A− phase and B+ phase, and A− phase and B− phase as shown in FIG. 4, each of the electrode layers 3 should be divided into two areas. In the case of making the bending movement in more directions than in this embodiment, the division number of each electrode layer 3 should accordingly be increased further from quarters. In reality, however, it is preferable, due to easiness of an electrical circuit portion and the manufacturing processes and the like, to divide the electrode layer 3 in quarters for the sake of low cost.

In the embodiment, the piezoelectric layers 2 and the electrode layers 3 are four layers respectively. In the case where there are two or more piezoelectric layers 2, the voltage can be lower than the case where there is one piezoelectric layer 2. To be more specific, the more piezoelectric layers 2 there are, the lower the voltage can be. The voltage can also be lowered by providing the electrode layers 3 in the inner diameter portion of the core 5 though it is necessary to connect them by the interlayer electrodes 4.

Figure 8B:
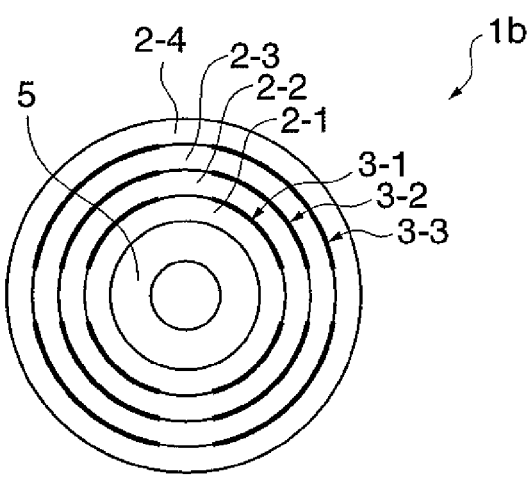

In the case where the electrode layer 3-4 as an outermost layer shown in FIG. 3A does not exist but the piezoelectric layer 2-4 exists as an outermost layer on the outer circumference of the electrode layer 3-3, the piezoelectric layer 2-4 as the outermost layer can be used as an insulating protective layer which does not have the piezoelectric active region. In this case, as shown in FIG. 8B, a stacked piezoelectric element 1b lowers the voltage in the two layers of the piezoelectric layers 2-2 and 2-3 having the actually polarized piezoelectric active regions. Thus, it is possible, by providing the protective layer as the outermost layer, to keep the electrode layers 3 from being exposed on the outer circumferential surface of the stacked piezoelectric element 1b so as to prevent a short or a current leak in the case where some object contacts it.

Figure 8C:
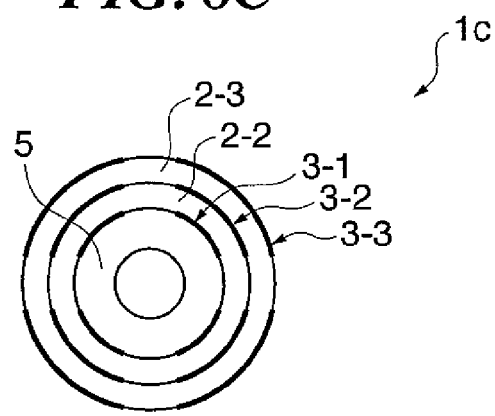
Figure 9A:
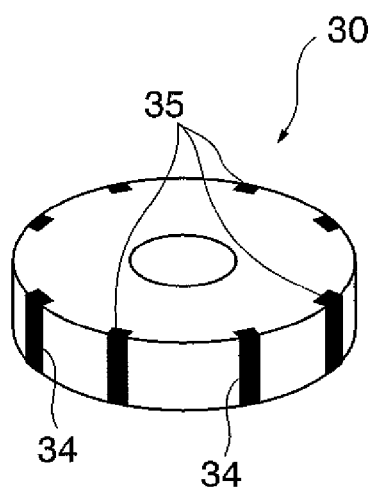
FIGS. 9A and 9B are perspective views showing the stacked piezoelectric element used for a vibrating body of a conventional columnar vibration wave motor, where
Figure 9B:
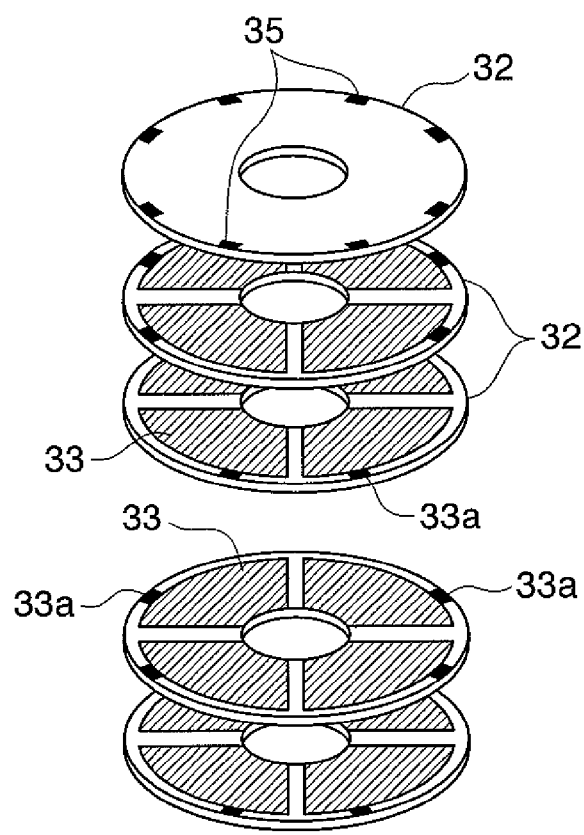
Figure 10:
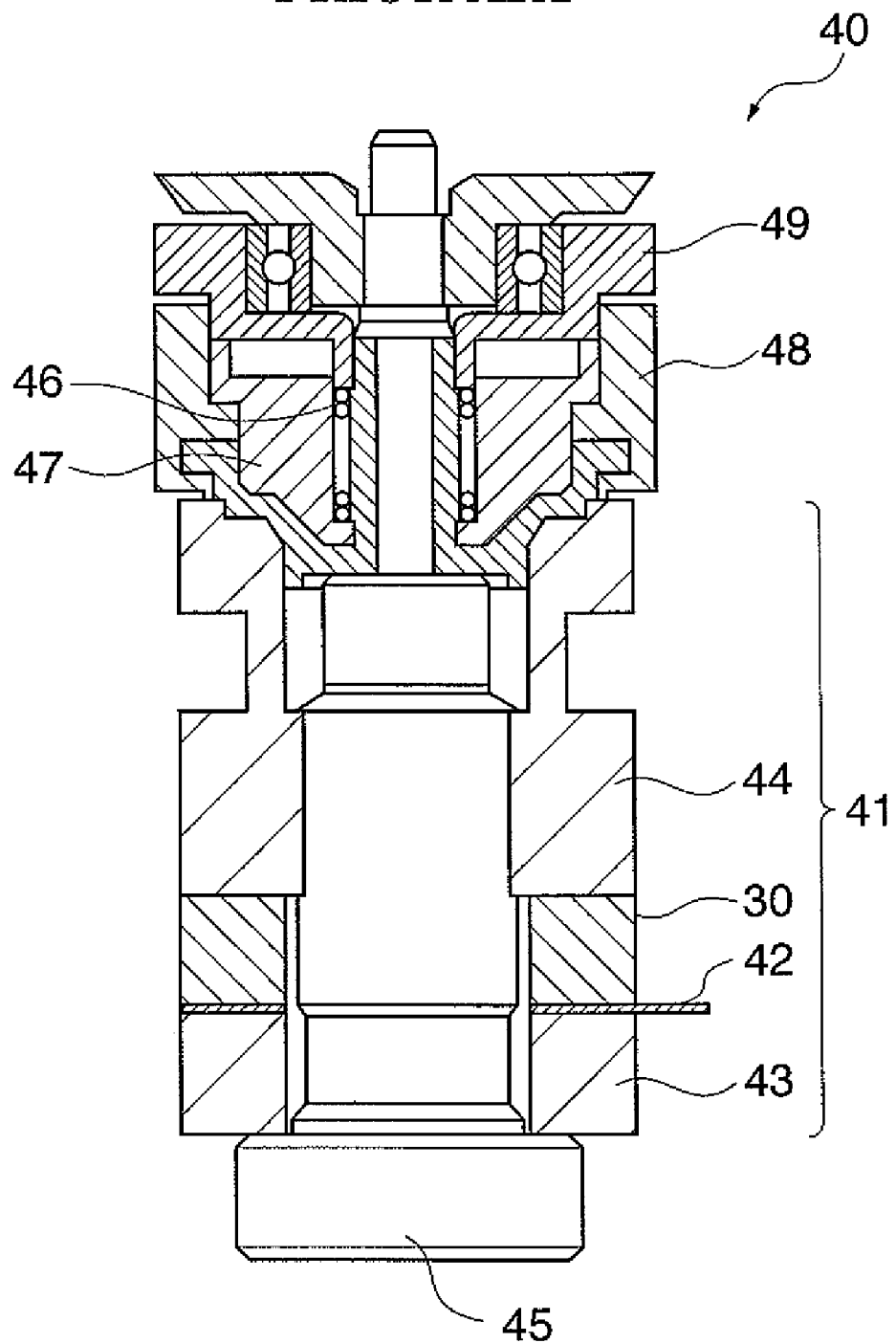
FIG. 10 is a sectional view showing a structure of the columnar vibration wave motor including the vibrating body using the stacked piezoelectric element of FIGS. 9A and 9B.

It is also possible to have no piezoelectric layers 2-1 existent and directly form the electrode layer 3-1 on the outer circumference of the core 5. In this case, as shown in FIG. 8C, a stacked piezoelectric element 1c can lower the voltage in the two layers of the piezoelectric layers 2-2 and 2-3 having the piezoelectric active regions. In the case where the core 5 is the sintered ceramics as previously described, however, exfoliation is apt to occur between the piezoelectric layers 2 and the core 5. Therefore, it is desirable to use ceramics yet to be sintered in this case.

Thus, according to the stacked piezoelectric element related to the above-mentioned embodiment and its variations, it is possible to create the vibrating body with the stacked piezoelectric element itself so that, on miniaturization of the vibration wave motor, the periodic damping can be suppressed to improve its performance. To be more specific, it is possible to eliminate a cause of the periodic damping due to joint or adhesion with a metal which conventionally deteriorated the performance of the vibration wave motor so as to improve the performance of the vibration wave motor. In addition, the manufacturing cost can be reduced. This is very advantageous when developing a new vibration wave motor aimed at small size and high output in future.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2006-135598 filed May 15, 2006 which is hereby incorporated by reference herein in its entirety.

What is claimed is:

1. A stacked piezoelectric element comprising:
a plurality of discrete cylindrical piezoelectric layers having different diameters inserted coaxially relative to each other and forming a cylindrically-shaped piezoelectric element; and
an electrode layer on a circumferential surface of each of the cylindrical piezoelectric layers,
wherein each of the electrode layers is divided into a plurality of discrete electrode layer regions along the circumferential surface of the respective cylindrical piezoelectric layer.

2. The stacked piezoelectric element according to claim 1, wherein the piezoelectric layers generate bending vibrations toward a central-axis direction of the cylinder in the case where an AC voltage is applied to at least one of the plurality of electrode layer regions in the same electrode layer.

3. The stacked piezoelectric element according to claim 2, further comprising a plurality of interlayer electrodes provided on an end face of the stacked piezoelectric layers,
wherein the interlayer electrodes conduct the plurality of electrode layer regions existing in different electrode layers and having the same center angle as one of the AC voltage-applied electrode layer regions.

4. The stacked piezoelectric element according to claim 3, wherein the interlayer electrodes are composed of at least a first interlayer electrode adapted to conduct first electrode layer regions existing in different electrode layers, a second interlayer electrode adapted to conduct second electrode layer regions existing in different electrode layers, and a third interlayer electrode adapted to conduct third electrode layer regions existing in different electrode layers.

5. The stacked piezoelectric element according to claim 4, wherein:
the plurality of electrode layers include at least a first electrode layer and a second electrode layer, each of which layers are divided into the plurality of discrete electrode layer regions along the circumferential surface respectively; and
the stacked piezoelectric element further comprises a third electrode layer having only a single electrode layer region around the circumferential surface of another cylindrical piezoelectric layer.

6. The stacked piezoelectric element according to claim 1, wherein each of the electrode layers are formed on an outer or inner circumference of the respective one of the cylindrical piezoelectric layers.

7. The stacked piezoelectric element according to claim 1, further including a core at the center of the stacked piezoelectric layers.

8. A vibration wave driving apparatus including:
a vibrating body adapted to make an oscillating movement by at least two bending vibrations; and
a contact body adapted to contact the vibrating body and move the contact body through frictional contact by vibrating the vibrating body,
wherein the vibrating body comprises a piezoelectric element comprising:
a plurality of discrete cylindrical piezoelectric layers having different diameters inserted coaxially relative to each other and forming a cylindrically-shaped piezoelectric element; and
an electrode layer on a circumferential surface of each of the cylindrical piezoelectric layers,
wherein each of the electrode layers is divided into a plurality of discrete electrode layer regions along the circumferential surface of the respective cylindrical piezoelectric layer.

* * * * *